(12) United States Patent
Lu et al.

(10) Patent No.: US 7,183,187 B2
(45) Date of Patent: Feb. 27, 2007

(54) INTEGRATION SCHEME FOR USING SILICIDED DUAL WORK FUNCTION METAL GATES

(75) Inventors: Jiong-Ping Lu, Richardson, TX (US); Gregory Shinn, Dallas, TX (US); Ping Jiang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/851,750

(22) Filed: May 20, 2004

(65) Prior Publication Data

US 2005/0260841 A1 Nov. 24, 2005

(51) Int. Cl.
  *H01L 21/3205* (2006.01)
(52) U.S. Cl. ............ 438/592; 438/656; 257/E21.203
(58) Field of Classification Search .......... 438/592, 438/584, 618, 630, 649–652, 655, 664, 678–679, 438/682; 257/204, 288
See application file for complete search history.

(56) References Cited

U.S. PATENT DOCUMENTS

| 5,397,909 | A  | * | 3/1995  | Moslehi ................ 257/383 |
| 5,565,384 | A  | * | 10/1996 | Havemann ............. 438/702 |
| 6,146,994 | A  | * | 11/2000 | Hwang .................. 438/633 |
| 6,200,871 | B1 | * | 3/2001  | Moslehi ................ 438/303 |
| 6,448,140 | B1 | * | 9/2002  | Liaw .................... 438/279 |
| 6,500,743 | B1 | * | 12/2002 | Lopatin et al. ......... 438/592 |
| 6,514,859 | B1 | * | 2/2003  | Erhardt et al. .......... 438/592 |
| 6,562,718 | B1 | * | 5/2003  | Xiang et al. ........... 438/682 |
| 6,627,502 | B1 | * | 9/2003  | Cho .................... 438/265 |
| 6,661,057 | B1 | * | 12/2003 | Dawson et al. ......... 257/336 |
| 6,812,145 | B2 | * | 11/2004 | Ma ..................... 438/653 |
| 6,885,105 | B2 | * | 4/2005  | Kakamu et al. ......... 257/774 |
| 2003/0030108 | A1 | * | 2/2003  | Morosawa ............. 257/359 |
| 2003/0183939 | A1 | * | 10/2003 | Kakamu et al. ......... 257/762 |
| 2003/0211684 | A1 | * | 11/2003 | Guo .................... 438/230 |
| 2005/0009343 | A1 | * | 1/2005  | Fishburn et al. ........ 438/689 |
| 2005/0136677 | A1 | * | 6/2005  | Brask et al. ........... 438/706 |

OTHER PUBLICATIONS

Eizenberg et al. reactively sputtered titanium carbide thin films: preparation and properties J. Appl Phys. vol. 54 No. 5 Jun. 1983 p. 3190-94.*

* cited by examiner

*Primary Examiner*—Chandra Chaudhari
(74) *Attorney, Agent, or Firm*—Jacqueline J. Garner; W. James Brady, III; Frederick J. Telecky, Jr.

(57) ABSTRACT

The present invention provides a method for manufacturing a semiconductor device and a method for manufacturing an integrated circuit including the semiconductor device. The method for manufacturing the semiconductor device, among other possible steps, includes forming a polysilicon gate electrode (250) over a substrate (210) and forming source/drain regions (610) in the substrate (210) proximate the polysilicon gate electrode (250). The method further includes forming a protective layer (710) over the source/drain regions (610) and the polysilicon gate electrode (250), then removing the protective layer (710) from over a top surface of the polysilicon gate electrode (250) while leaving the protective layer (710) over the source/drain regions (250). After the protective layer (710) has been removed from over the top surface of the polysilicon gate electrode (250), the polysilicon gate electrode (250) is silicided to form a silicided gate electrode (1310). The protective layer (710) is also removed from over the source/drain regions (610) and source/drain contact regions (1610) are formed.

15 Claims, 18 Drawing Sheets

INTEGRATION SCHEME FOR USING SILICIDED DUAL WORK FUNCTION METAL GATES

TECHNICAL FIELD OF THE INVENTION

The present invention is directed, in general, to a method for manufacturing a semiconductor device and, more specifically, to a method for manufacturing a semiconductor device having a silicided gate electrode and a method for manufacturing an integrated circuit including the same.

BACKGROUND OF THE INVENTION

Metal gate electrodes are currently being investigated to replace polysilicon gate electrodes in today's ever shrinking and changing transistor devices. One of the principal reasons the industry is investigating replacing the polysilicon gate electrodes with metal gate electrodes is to solve problems of poly-depletion effects and boron penetration for future CMOS devices. Traditionally, a polysilicon gate electrode with an overlying silicide was used for the gate electrodes in CMOS devices. However, as device feature sizes continue to shrink, poly depletion becomes a serious issue when using polysilicon gate electrodes.

Accordingly, metal gates have been proposed. However, in order to optimize the threshold voltage ($V_t$) in CMOS devices, the metal gates need dual tunable work functions. For instance, the metal gates need tunable work functions for NMOS and PMOS devices similar to present polysilicon gate technology, requiring the work functions of metal gates to range from 4.1~4.4 eV for NMOS and 4.8~5.1 eV for PMOS (see, B. Cheng, B. Maiti, S. Samayedam, J. Grant, B. Taylor, P. Tobin, J. Mogab, *IEEE Intl. SOI Conf. Proc.*, pp. 91–92, 2001).

Recently, silicided metal gates have been investigated based on the extension of existing self-aligned silicide (SALICIDE) technology. In this approach, polysilicon is deposited over the gate dielectric. A metal is deposited over the polysilicon and reacted to completely consume the polysilicon resulting in a fully silicided metal gate, rather than a deposited metal gate. The silicided metal gate provides a metal gate with the least perturbation to the conventional process and avoids contamination issues. Furthermore, poly doping has been shown to affect the work function of the silicided metal gates.

The silicided metal gates are not without their problems. One of the more significant problems associated with the silicided metal gates is attributed to the simultaneous formation of the silicided metal gate and the silicided source/drain regions. When formed simultaneously, the depth of the silicided source/drain regions is directly proportional to the thickness of the polysilicon gate electrode. As the polysilicon gate electrodes currently range in thickness from about 60 nm to about 120 nm, the silicided source/drain regions ultimately extend into the silicon substrate by up to about 60 nm to about 120 nm, respectively. Deep silicided source/drain regions are nonetheless undesirable, as they tend to cause leakage problems.

Various companies in the industry have attempted to separate the silicidation of the polysilicon gate and the silicidation of the source/drain regions. In such integration schemes, the gate electrode is masked by a silicon oxide layer and a silicide is then formed on the source/drain regions. Next, a blanket dielectric layer is deposited over the gate stack and silicided source/drain regions. A CMP process is then employed to expose the gate electrode for silicidation, while the source/drain regions are covered by the protective dielectric layer. This approach unfortunately contains numerous drawbacks.

Accordingly, what is needed is a method for manufacturing silicided metal gate structures separate from the silicided source/drain regions that does not experience the drawbacks of the prior art methods.

SUMMARY OF THE INVENTION

To address the above-discussed deficiencies of the prior art, the present invention provides a method for manufacturing a semiconductor device and a method for manufacturing an integrated circuit including the semiconductor device. The method for manufacturing the semiconductor device, among other possible steps, includes forming a polysilicon gate electrode over a substrate and forming source/drain regions in the substrate proximate the polysilicon gate electrode. The method further includes forming a protective layer over the source/drain regions and the polysilicon gate electrode, then removing the protective layer from over a top surface of the polysilicon gate electrode while leaving the protective layer over the source/drain regions. After the protective layer has been removed from over the top surface of the polysilicon gate electrode, the polysilicon gate electrode is silicided to form a silicided gate electrode.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
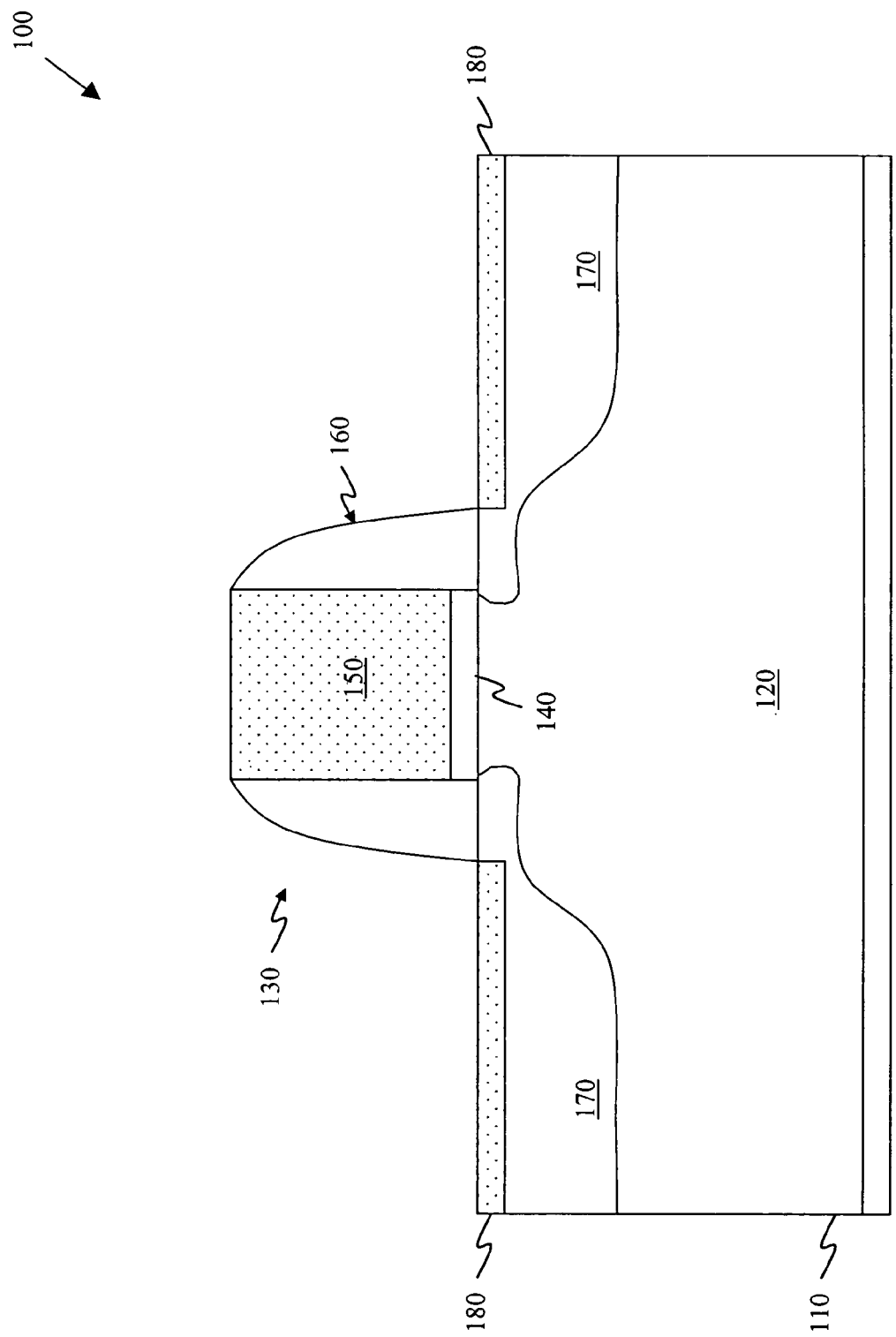
FIG. 1 illustrates a cross-sectional view of one embodiment of a semiconductor device constructed according to the principles of the present invention.

Referring initially to FIG. 1, illustrated is a cross-sectional view of one embodiment of a semiconductor device 100 constructed according to the principles of the present invention. In the embodiment illustrated in FIG. 1, the semiconductor device 100 includes a substrate 110. Located within the substrate 110 in the embodiment of FIG. 1 is a well region 120. Additionally located over the substrate 110 and well region 120 is a gate structure 130.

The gate structure 130 illustrated in FIG. 1 includes a gate oxide 140 located over the substrate 110, as well as a silicided gate electrode 150 located over the gate oxide 140. While the silicided gate electrode 150 is illustrated in FIG. 1 as a fully silicided gate electrode, those skilled in the art understand that the silicided gate electrode 150 could also comprise a partially silicided gate electrode where only the top portion of the electrode is silicided. This embodiment might be used if there was a need to reduce the contact resistance of the silicided gate electrode 150.

The silicided gate electrode 150 may have a variety of thicknesses, nonetheless, a thickness ranging from about 50 nm to about 150 nm is exemplary. The silicided gate electrode 150, when constructed in accordance with the principles of the present invention, may comprise a number of different materials. For instance, in the illustrative embodiment shown in FIG. 1 the silicided gate electrode 150 comprises nickel, however, it is envisioned that the silicided gate electrode 150 could comprise cobalt, platinum, titanium, tantalum, molybdenum, tungsten, etc., while staying within the scope of the present invention.

The silicided gate electrode 150 may also include a dopant or combination of several types of dopants therein. The dopant, such as boron, phosphorous, arsenic or another similar dopant based on whether the semiconductor device 100 is operating as a PMOS device or an NMOS device, is configured to tune the minimum energy required to bring an electron from the Fermi level to the vacuum level, or the so called work function.

The gate structure 130 further contains gate sidewall spacers 160 flanking both sides of the silicided gate electrode 150 and gate oxide 140. While the gate sidewall spacers 160 in the embodiment of FIG. 1 include only one layer each, those skilled in the art understand that in many different embodiments the gate sidewall spacers 160 comprise two or more layers. The additional layers, among other materials, could include a collection of oxides and nitrides.

The semiconductor device 100 illustrated in FIG. 1 additionally includes conventional source/drain regions 170 located within the substrate 110 and proximate the gate oxide 140. Located within the source/drain regions 170 are source/drain contact regions 180. The source/drain contact regions 180, when manufactured in accordance with the principles of the present invention, comprise a metal silicide. In one embodiment, the source/drain contact regions 180 comprise a metal silicide similar to the metal silicide of the silicided gate electrode 150. However, in another embodiment they comprise a metal silicide different from the metal silicide of the silicided gate electrode 150. In the illustrative embodiment of FIG. 1 the source/drain contact regions 180 have a depth into the source/drain regions 170 ranging from about 10 nm to about 35 nm, among others. This depth, however, may vary depending on the specific desires of the manufacturer.

Figure 2:
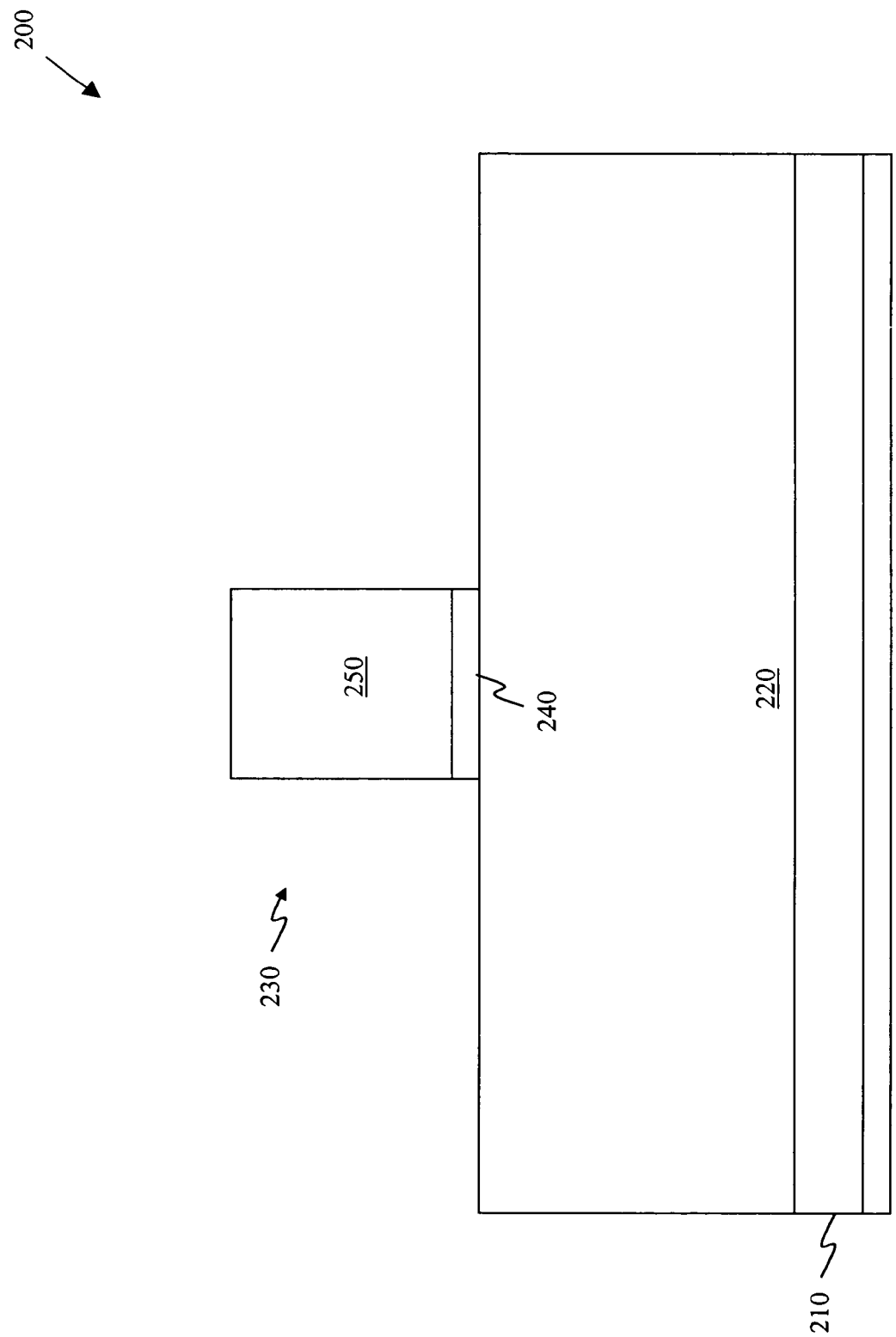
FIG. 2 illustrates a cross-sectional view of a partially completed semiconductor device manufactured in accordance with the principles of the present invention.

Turning now to FIGS. 2–16, illustrated are cross-sectional views of detailed manufacturing steps instructing how one might, in an advantageous embodiment, manufacture a semiconductor device similar to the semiconductor device 100 depicted in FIG. 1. FIG. 2 illustrates a cross-sectional view of a partially completed semiconductor device 200 manufactured in accordance with the principles of the present invention. The partially completed semiconductor device 200 of FIG. 2 includes a substrate 210. The substrate 210 may, in an exemplary embodiment, be any layer located in the partially completed semiconductor device 200, including a wafer itself or a layer located above the wafer (e.g., epitaxial layer). In the embodiment illustrated in FIG. 2, the substrate 210 is a P-type substrate; however, one skilled in the art understands that the substrate 210 could be an N-type substrate without departing from the scope of the present invention. In such a case, each of the dopant types described throughout the remainder of this document would be reversed. For clarity, no further reference to this opposite scheme will be discussed.

Located within the substrate 210 in the embodiment shown in FIG. 2 is a well region 220. The well region 220, in light of the P-type semiconductor substrate 210, would more than likely contain an N-type dopant. For example, the well region 220 would likely be doped with an N-type dopant dose ranging from about 1E13 atoms/cm$^2$ to about 1E14 atoms/cm$^2$ and at an energy ranging from about 100 keV to about 500 keV. This results in the well region 220 having a peak dopant concentration ranging from about 5E17 atoms/cm$^3$ to about 1E19 atoms/cm$^3$. Other dopant types and concentrations are nonetheless within the scope of the present invention.

Located over the substrate 210 in the embodiment of FIG. 2 is a gate structure 230. The gate structure 230 includes a gate oxide 240 and a polysilicon gate electrode 250. The gate oxide 240 may comprise a number of different materials and stay within the scope of the present invention. For example, the gate oxide 240 may comprise silicon dioxide, or in an alternative embodiment comprise a high dielectric constant (K) material. In the illustrative embodiment of FIG. 2, however, the gate oxide 240 is a silicon dioxide layer having a thickness ranging from about 0.5 nm to about 5 nm.

Any one of a plurality of manufacturing techniques could be used to form the gate oxide 240. For example, the gate oxide 240 may be either grown or deposited. Additionally, the growth or deposition steps may require a significant number of different temperatures, pressures, gasses, flow rates, etc.

While the advantageous embodiment of FIG. 2 illustrates that the polysilicon gate electrode 250 comprise standard polysilicon, other embodiments exist where the polysilicon gate electrode, or at least a portion thereof, comprises amorphous polysilicon. The amorphous polysilicon embodiment may be particularly useful when a substantially planar upper surface of the polysilicon gate electrode 250 is desired.

The deposition conditions for the polysilicon gate electrode 250 may vary. However, if the polysilicon gate electrode 250 were to comprise standard polysilicon, such as the instance in FIG. 2, the polysilicon gate electrode 250 could be deposited using a pressure ranging from about 100 torr to about 300 torr, a temperature ranging from about 620° C. to about 700° C., and a SiH$_4$ or Si$_2$H$_6$ gas flow ranging from about 50 sccm to about 150 sccm. If amorphous polysilicon were desired, the amorphous polysilicon gate electrode could be deposited using a pressure ranging from about 100 torr to about 300 torr, a temperature ranging from about 450° C. to about 550° C., and a SiH$_4$ or Si$_2$H$_6$ gas flow ranging from about 100 sccm to about 300 sccm. In any instance, the polysilicon gate electrode 250 desirably has a thickness ranging from about 50 nm to about 150 nm.

Those skilled in the art understand that the gate oxide 240 and polysilicon gate electrode 250 were originally blanket grown or deposited. Those blanket layers were subsequently patterned resulting in the gate oxide 240 and polysilicon gate electrode 250 illustrated in FIG. 2.

Figure 3:
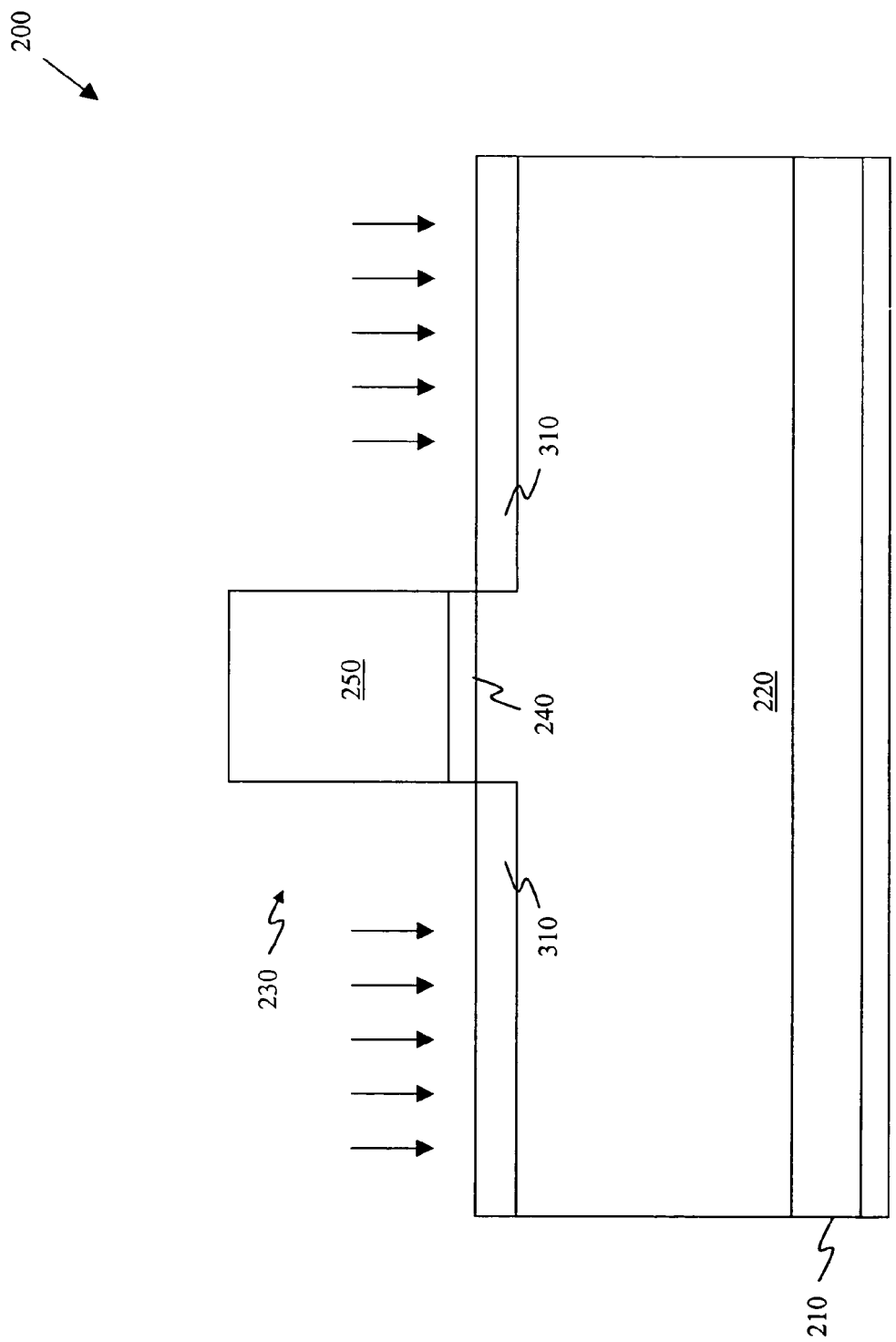
FIG. 3 illustrates a cross-sectional view of the partially completed semiconductor device illustrated in FIG. 2 after formation of lightly doped extension implants within the substrate.

Turning briefly to FIG. 3 illustrated is a cross-sectional view of the partially completed semiconductor device 200 illustrated in FIG. 2 after formation of lightly doped extension implants 310 within the substrate 210. The lightly doped extension implants 310 are conventionally formed and generally have a peak dopant concentration ranging from about 1E19 atoms/cm$^3$ to about 2E20 atoms/cm$^3$. As is standard in the industry, the lightly doped extension implants 310 have a dopant type opposite to that of the well region 220 they are located within. Accordingly, the lightly doped extension implants 310 are doped with a P-type dopant in the illustrative embodiment shown in FIG. 3.

Figure 4:
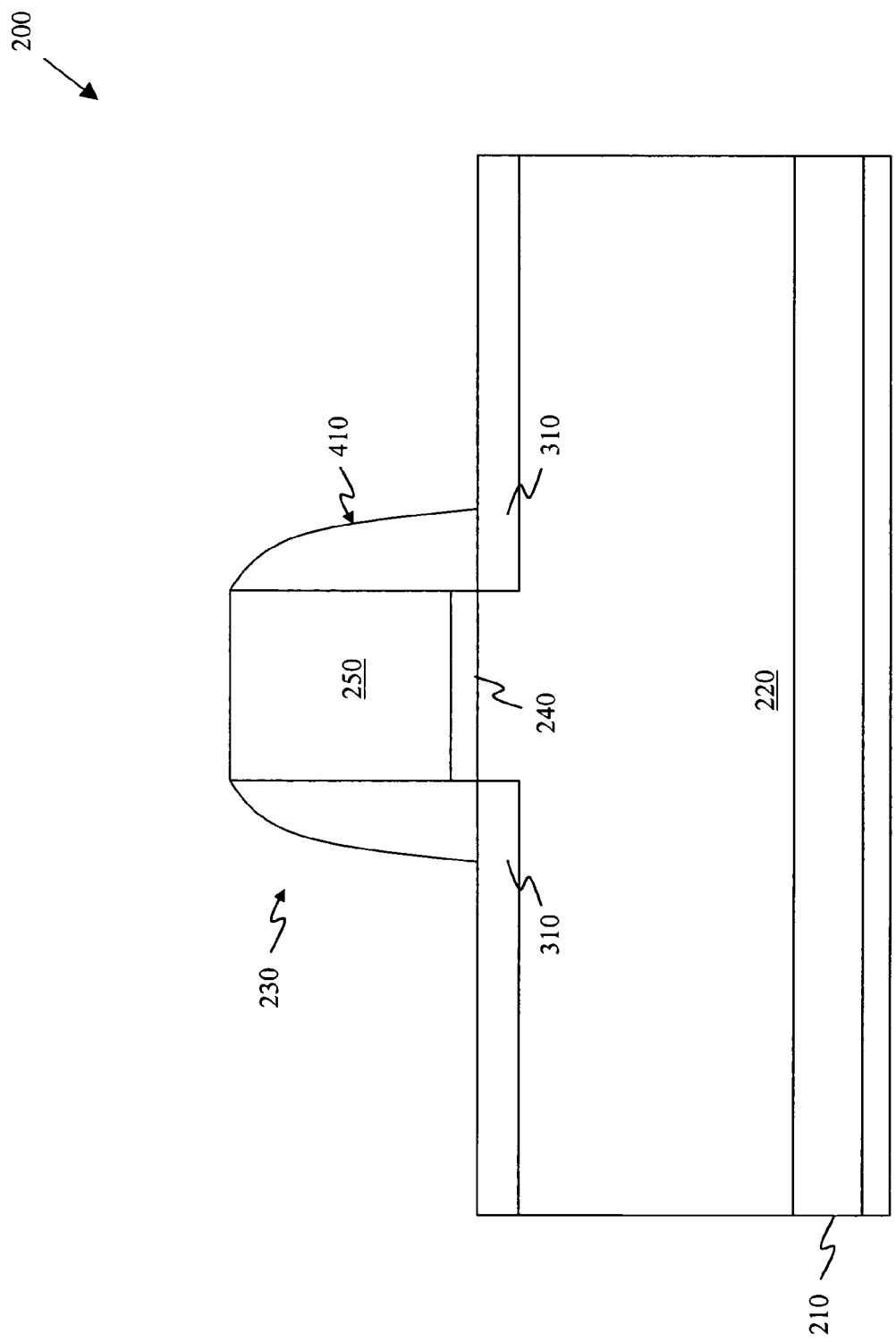
FIG. 4 illustrates a cross-sectional view of the partially completed semiconductor device illustrated in FIG. 3 after forming gate sidewall spacers.

Turning now to FIG. 4, illustrated is a cross-sectional view of the partially completed semiconductor device 200 illustrated in FIG. 3 after forming gate sidewall spacers 410. The gate sidewall spacers 410 illustrated in FIG. 4 are conventional gate sidewall spacers. In the given embodiment of FIG. 4, the gate sidewall spacers 410 were blanket deposited and then subjected to an anisotropic etch, resulting in structures similar to that shown in FIG. 4. Other gate sidewall spacers 410 including two or more layers could also be used.

Figure 5:
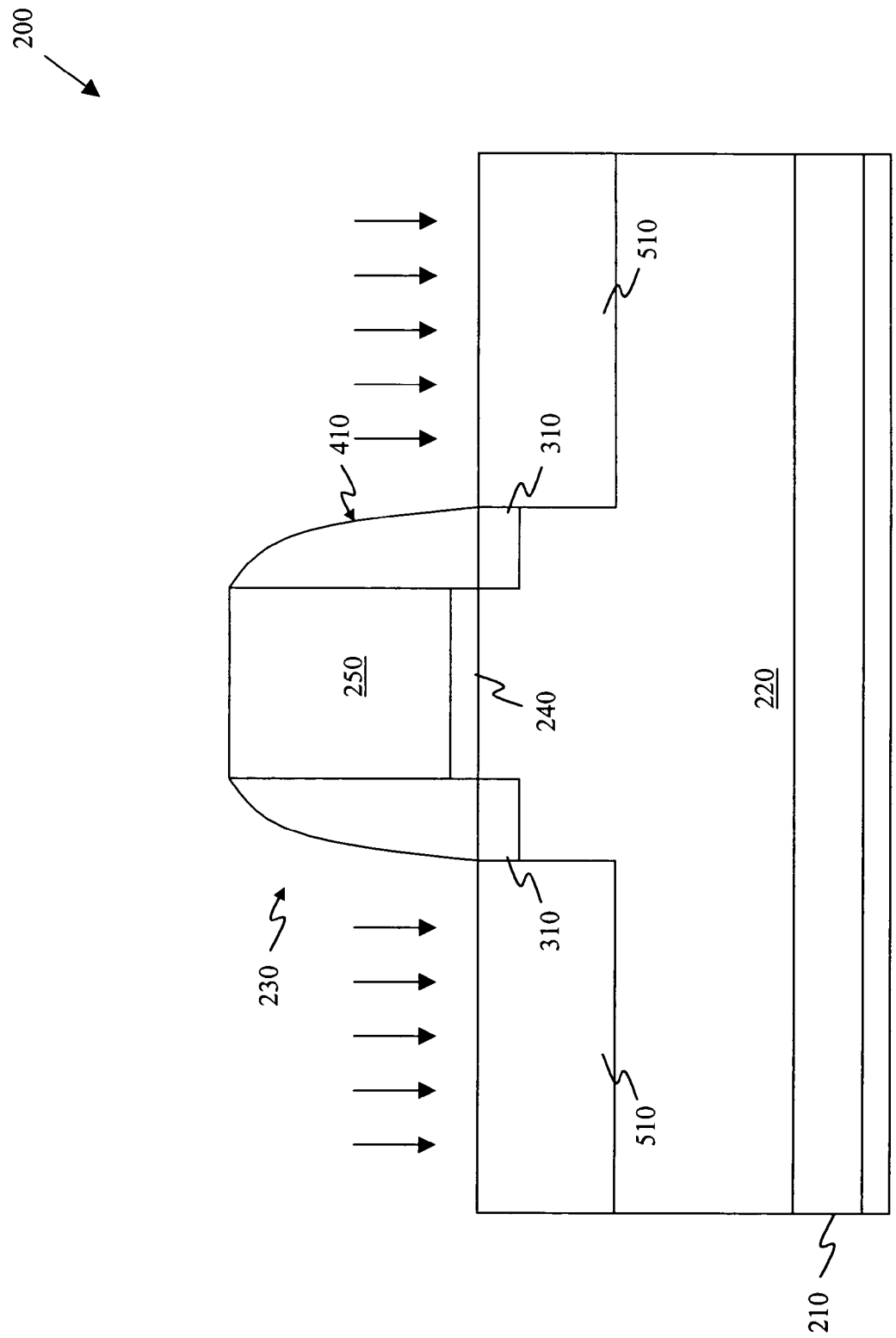
FIG. 5 illustrates a cross-sectional view of the partially completed semiconductor device illustrated in FIG. 4 after formation of highly doped source/drain implants within the substrate.

Turning now to FIG. 5, illustrated is a cross-sectional view of the partially completed semiconductor device 200 illustrated in FIG. 4 after formation of highly doped source/drain implants 510 within the substrate 210. The formation of the highly doped source/drain implants 510 is conventional. Generally the highly doped source/drain implants 510 have a peak dopant concentration ranging from about 1E18 atoms/cm$^3$ to about 1E21 atoms/cm$^3$. Also, the highly doped source/drain implants 510 should typically have a dopant type opposite to that of the well region 220 they are located within. Accordingly, in the illustrative embodiment shown in FIG. 5, the highly doped source/drain implants 510 are doped with a P-type dopant.

Figure 6:
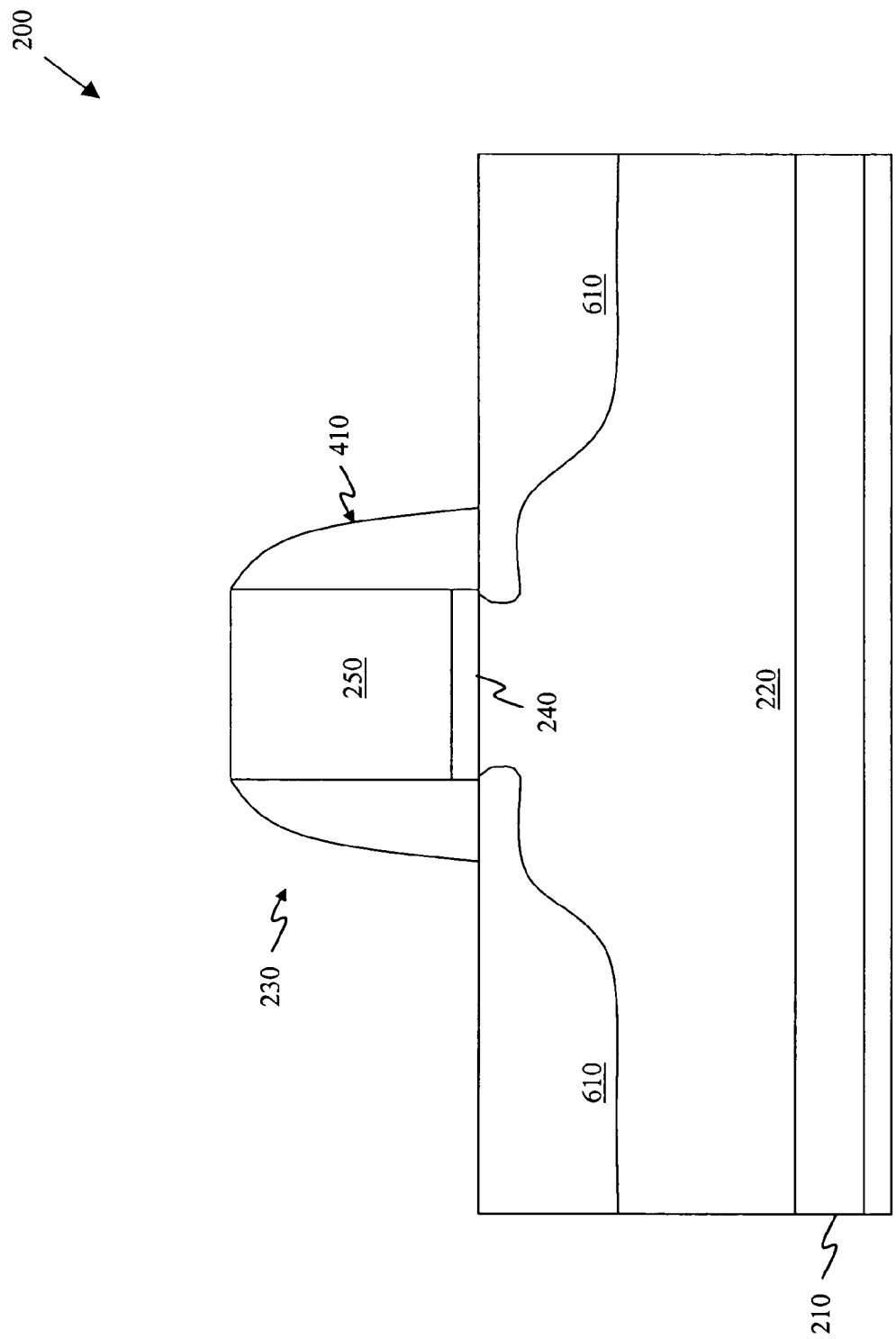
FIG. 6 illustrates a cross-sectional view of the partially completed semiconductor device illustrated in FIG. 5 after subjecting the semiconductor device to a standard source/drain anneal, thereby activating source/drain regions.

Turning now to FIG. 6, illustrated is a cross-sectional view of the partially completed semiconductor device 200 illustrated in FIG. 5 after subjecting the semiconductor device 200 to a standard source/drain anneal, thereby activating source/drain regions 610. It is believed that a source/drain anneal conducted at a temperature ranging from about 1000° C. to about 1100° C. and a time period ranging from about 1 second to about 5 seconds would be sufficient. It should be noted that other temperatures, times, and processes could be used to activate the source/drain regions 610.

Figure 7:
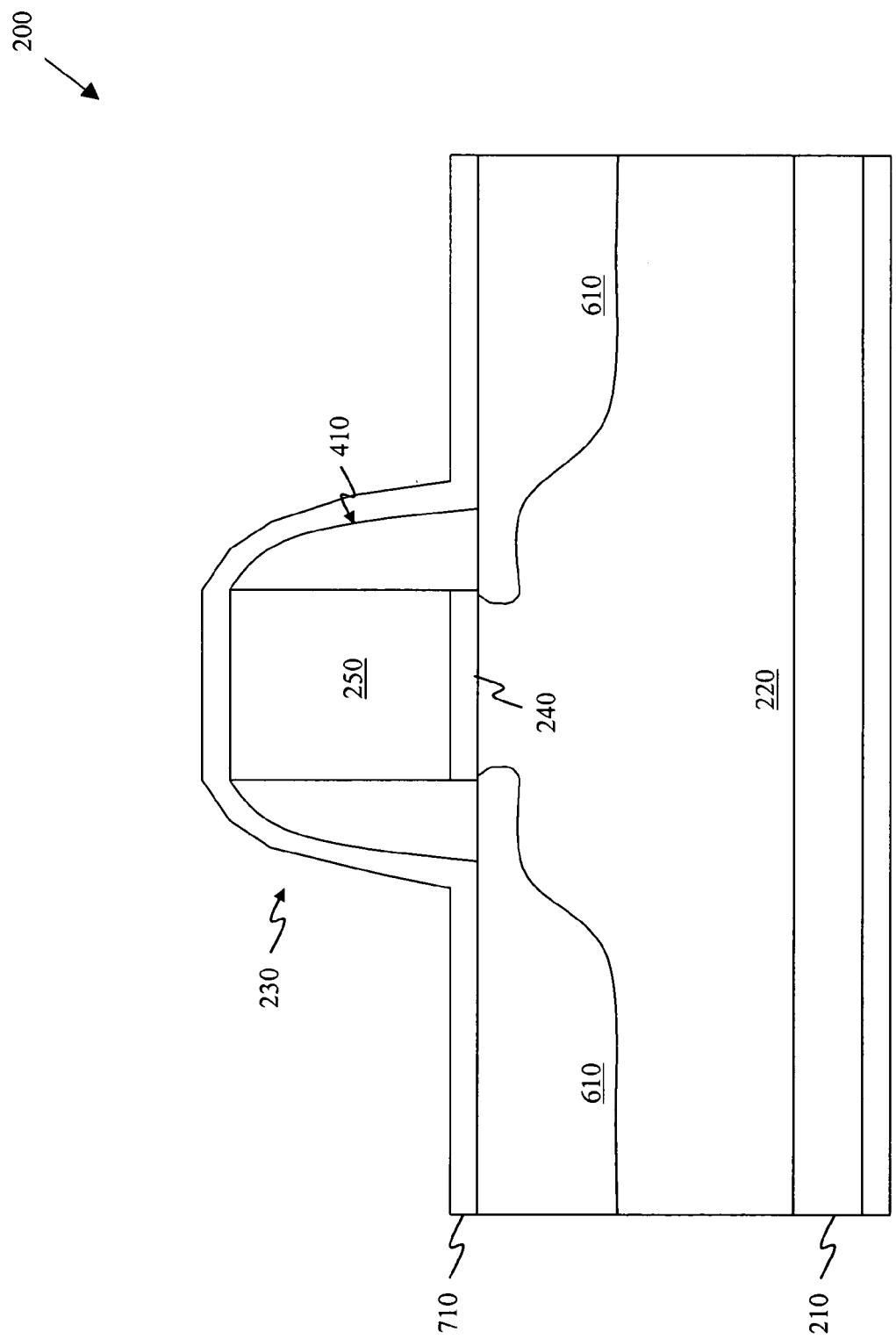
FIG. 7 illustrates a cross-sectional view of the partially completed semiconductor device illustrated in FIG. 6 after forming a protective layer over the source/drain regions and the polysilicon gate electrode.

Turning now to FIG. 7, illustrated is a cross-sectional view of the partially completed semiconductor device 200 illustrated in FIG. 6 after forming a protective layer 710 over the source/drain regions 610 and the polysilicon gate electrode 250. In the particular embodiment shown, the protective layer is blanket deposited, for example using a conventional physical vapor deposition (PVD) or chemical vapor deposition (CVD) process, directly on the source/drain regions 610 and the polysilicon gate electrode 250. The protective layer 710 in one advantageous embodiment comprises a transition metal nitride, such as titanium nitride. In an alternative embodiment, however, the protective layer 710 comprises a transition metal carbide or another similar material. While the protective layer 710 may comprise a number of different thicknesses while staying within the scope of the present invention, thicknesses ranging from about 5 nm to about 50 nm, and preferably of about 20 nm, are exemplary.

Figure 8:
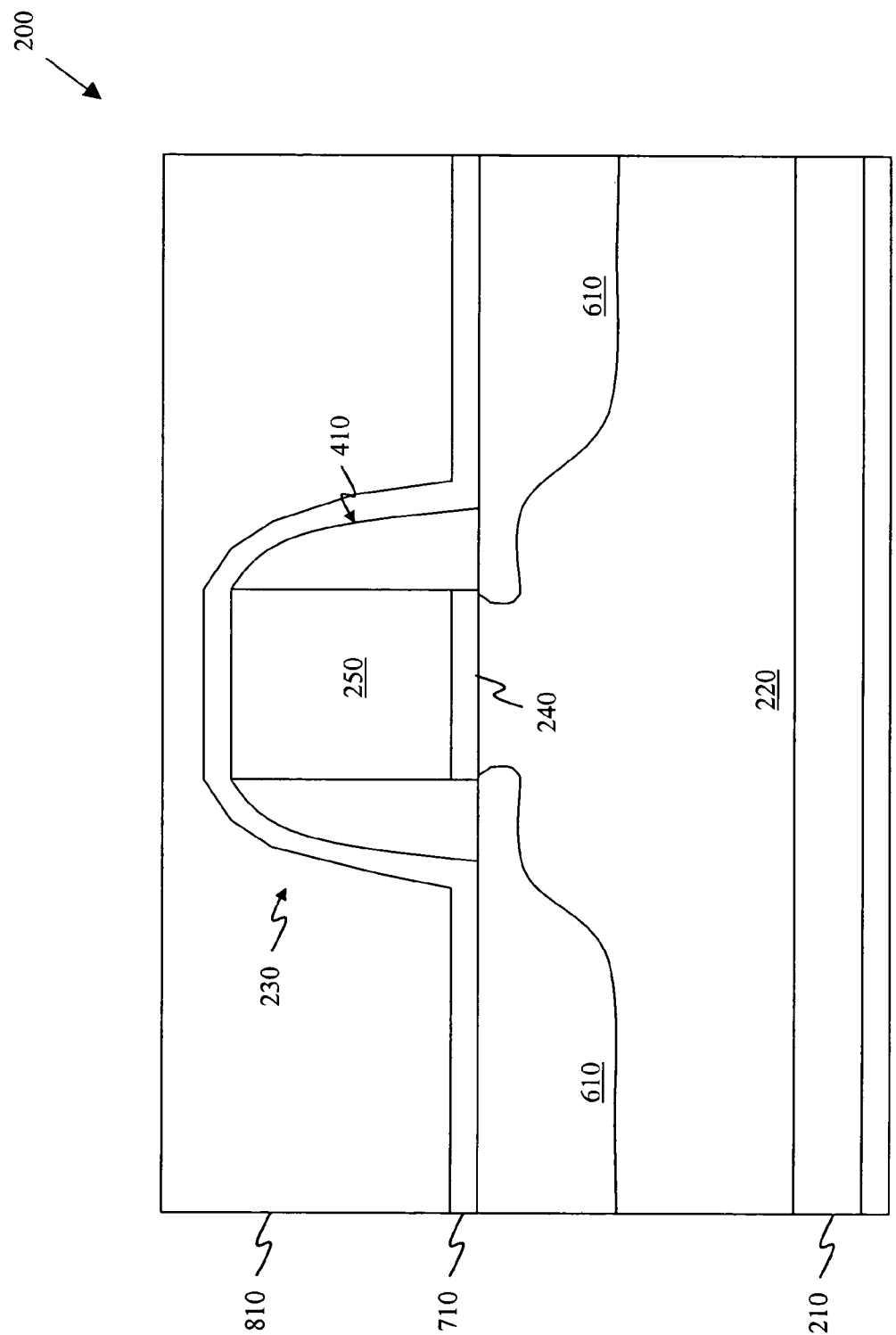
FIG. 8 illustrates a cross-sectional view of the partially completed semiconductor device illustrated in FIG. 7 after forming a masking layer over portions of the protective layer.

Turning now to FIG. 8, illustrated is a cross-sectional view of the partially completed semiconductor device 200 illustrated in FIG. 7 after forming a masking layer 810 over portions of the protective layer 710. The masking layer 810 may comprise various materials. For instance, it is believed that the masking layer 810 may advantageously comprise an organic material, such as an organic photoresist material or organic bottom antireflective coating (BARC) material, and provide the intended masking properties while still being easy to remove. Nevertheless, inorganic materials, such as inorganic hardmasks could be used for the masking layer 810.

The masking layer 810, as shown, is advantageously formed to a thickness sufficient to cover the top surface of the gate structure 230 and any protective layer 710 located thereover. Thus, in an exemplary embodiment the thickness of the masking layer 810 is chosen such that it completely covers the tallest gate structure 230 that might be located on the entire substrate 210. It is believed that a thickness ranging from about 120 nm to about 300 nm would be sufficient to accommodate all gate structures 230. Nevertheless, the present invention is not limited to such thicknesses. Conventional deposition or other processes could be used to form the masking layer 810.

Figure 9:
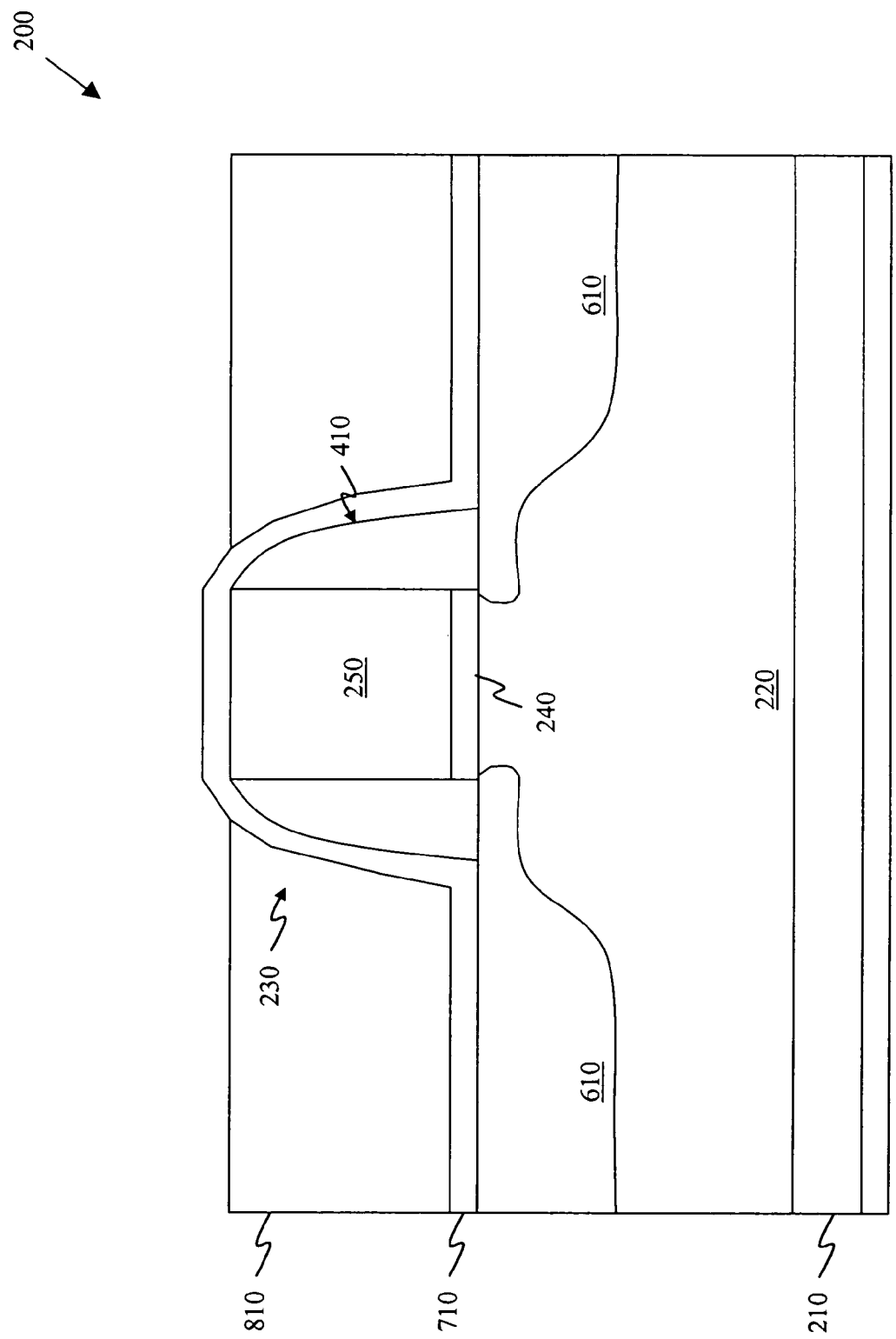
FIG. 9 illustrates a cross-sectional view of the partially completed semiconductor device illustrated in FIG. 8 after etching, or otherwise removing, excess portions of the masking layer.

Turning now to FIG. 9, illustrated is a cross-sectional view of the partially completed semiconductor device 200 illustrated in FIG. 8 after etching, or otherwise removing, excess portions of the masking layer 810. In an exemplary embodiment the masking layer 810 is chemical mechanical polished (CMP) or etched (e.g., dry etched) back to the upper surface of the protective layer 710. In the particular embodiment shown in FIG. 9 the masking layer 810 is removed back to a height substantially similar to the height of the polysilicon gate electrode 250. Regardless of how much or little masking layer 810 is actually removed, it is important that the portion of the protective layer 710 covering the upper portion of the polysilicon gate electrode 250 be exposed. As indicated before, the masking layer 810 may be either polished or etched back to its desired thickness.

Figure 10:
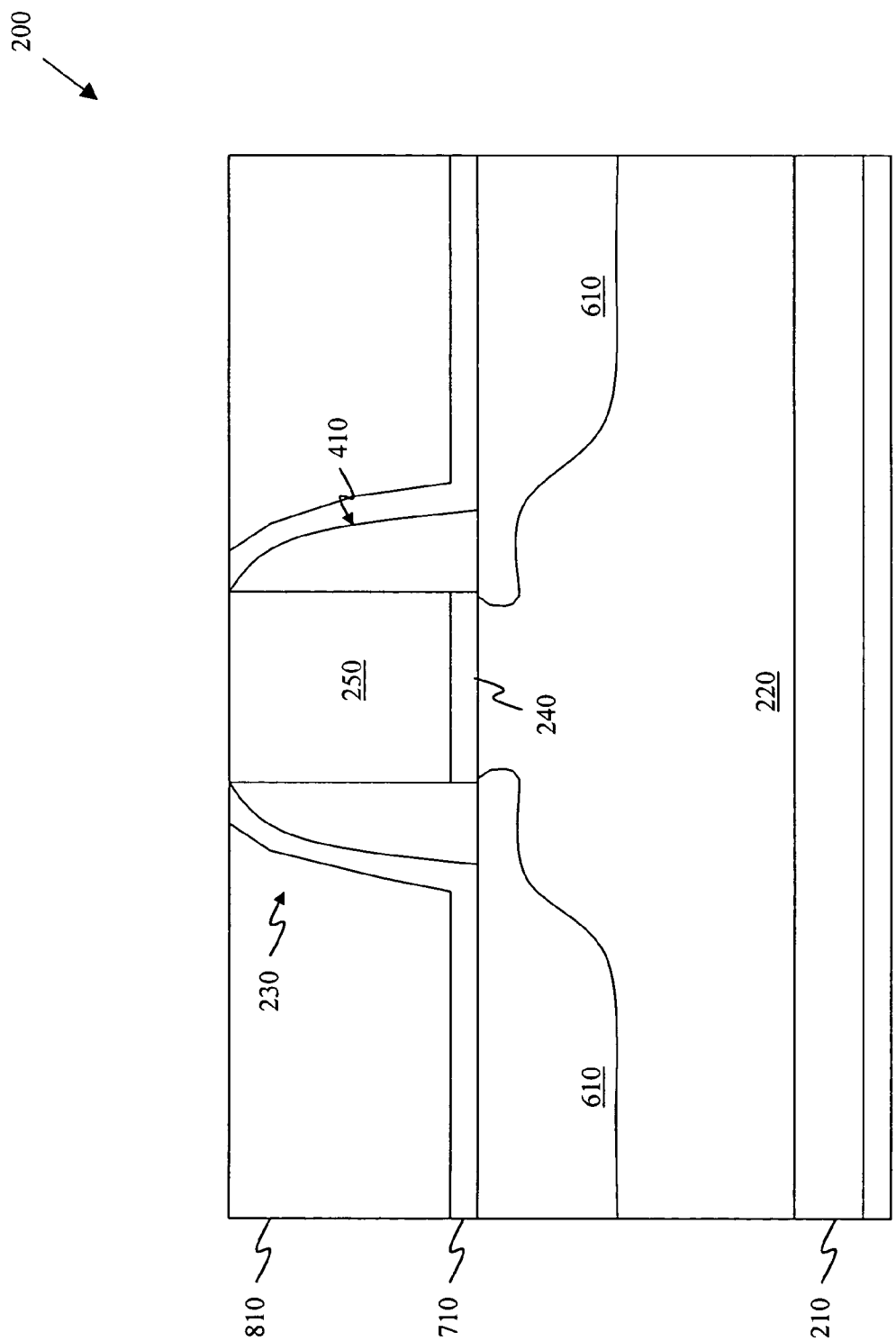
FIG. 10 illustrates a cross-sectional view of the partially completed semiconductor device illustrated in FIG. 9 after removing any exposed portions of the protective layer over the polysilicon gate electrode.

Turning now to FIG. 10, illustrated is a cross-sectional view of the partially completed semiconductor device 200 illustrated in FIG. 9 after removing any exposed portions of the protective layer 710. Many different processes could be used to remove this exposed portion. In the exemplary embodiment of FIG. 10, however, the exposed portions are removed using a CMP process. In one advantageous embodiment of the invention, the masking layer 810 and protective layer 710 are polished in the same step. In this embodiment, the protective layer 710 would act as a partial polish stop layer, indicating to the polishing device or person that the protective layer 710 has been contacted and that in a short amount of time the polysilicon gate electrode 250 will be exposed. Those skilled in the art of polishing understand the different techniques and mechanisms that might be used to optimize this polishing step.

While the above paragraph focuses on the CMP removal of the exposed portions of the protective layer 710, those skilled in the art understand that a conventional etch could also be used to remove the exposed portions of the protective layer 710. In an exemplary embodiment, the etch would be a dry plasma etch. Other etches, however, could also be used.

Figure 11:
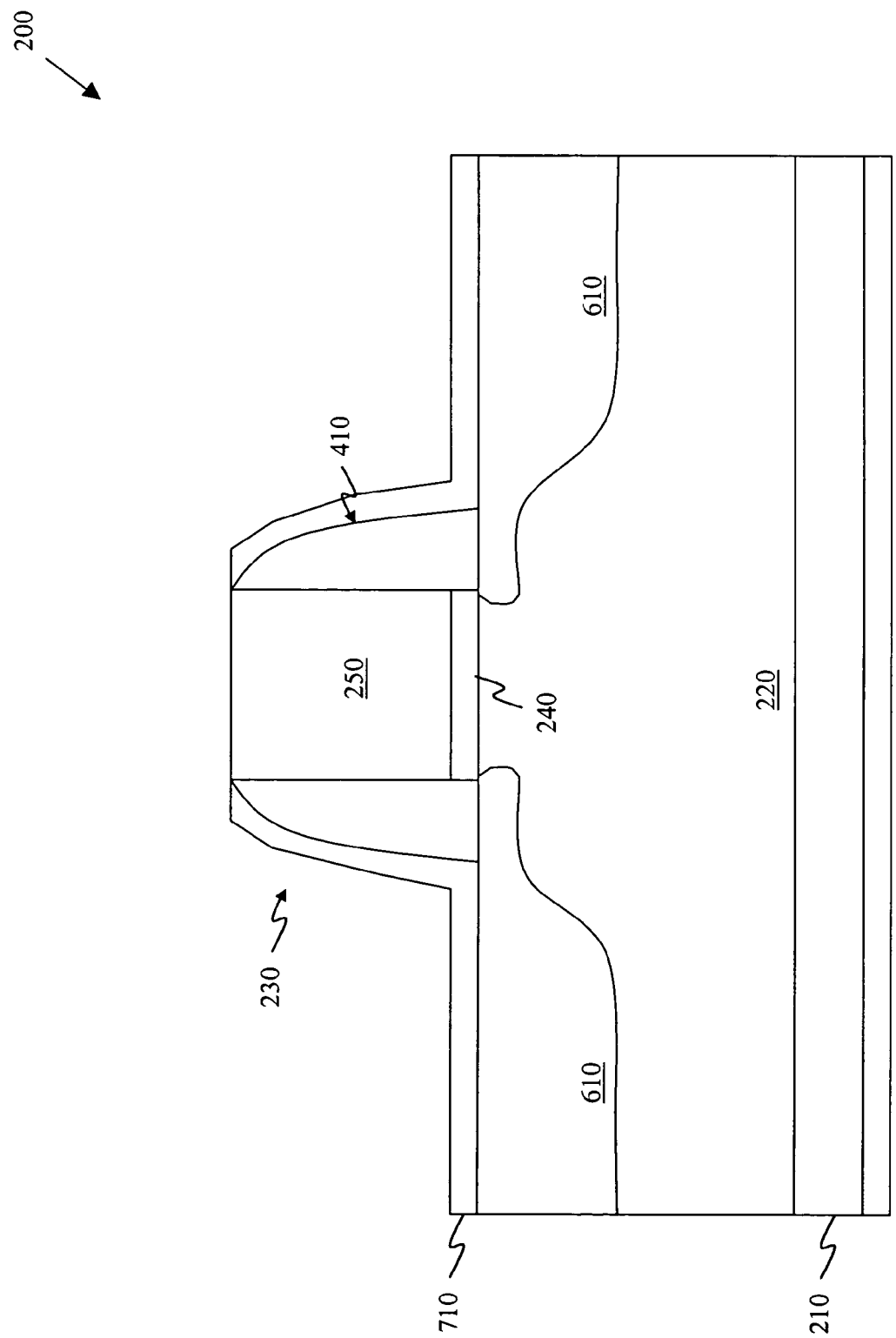
FIG. 11 illustrates a cross-sectional view of the partially completed semiconductor device illustrated in FIG. 10 after removing the remaining portions of the masking layer.

Turning now to FIG. 11, illustrated is a cross-sectional view of the partially completed semiconductor device 200 illustrated in FIG. 10 after removing the remaining portions of the masking layer 810. In the embodiments where the masking layer 810 comprises an organic material, it may be removed very easily using a conventional ashing process. In those embodiments where the masking layer 810 comprises an inorganic material, it may be removed using other well known processes.

FIGS. 8–10 have been directed to a specific embodiment wherein the masking layer 810 is used. Other variations from that illustrated in FIGS. 8–10 may nonetheless be used to expose the polysilicon gate electrode 250. For instance, in one alternative embodiment the partially completed semiconductor device 200 illustrated in FIG. 7 is patterned using well known photolithography process and then etched to expose the protective layer 710, rather than polished or etched without being patterned first. While this embodiment may be used, it requires that a reticle be manufactured and used, which would undoubtedly increase the time and cost of manufacturing the semiconductor device 200, at least as compared to that disclosed in FIGS. 8–10. In an alternative embodiment no masking layer 810 is used at all. In this embodiment a standard CMP process removes the protective layer 710 from the tops of each of the polysilicon gate electrodes 250. Other techniques neither shown nor discussed could also be used.

Figure 12:
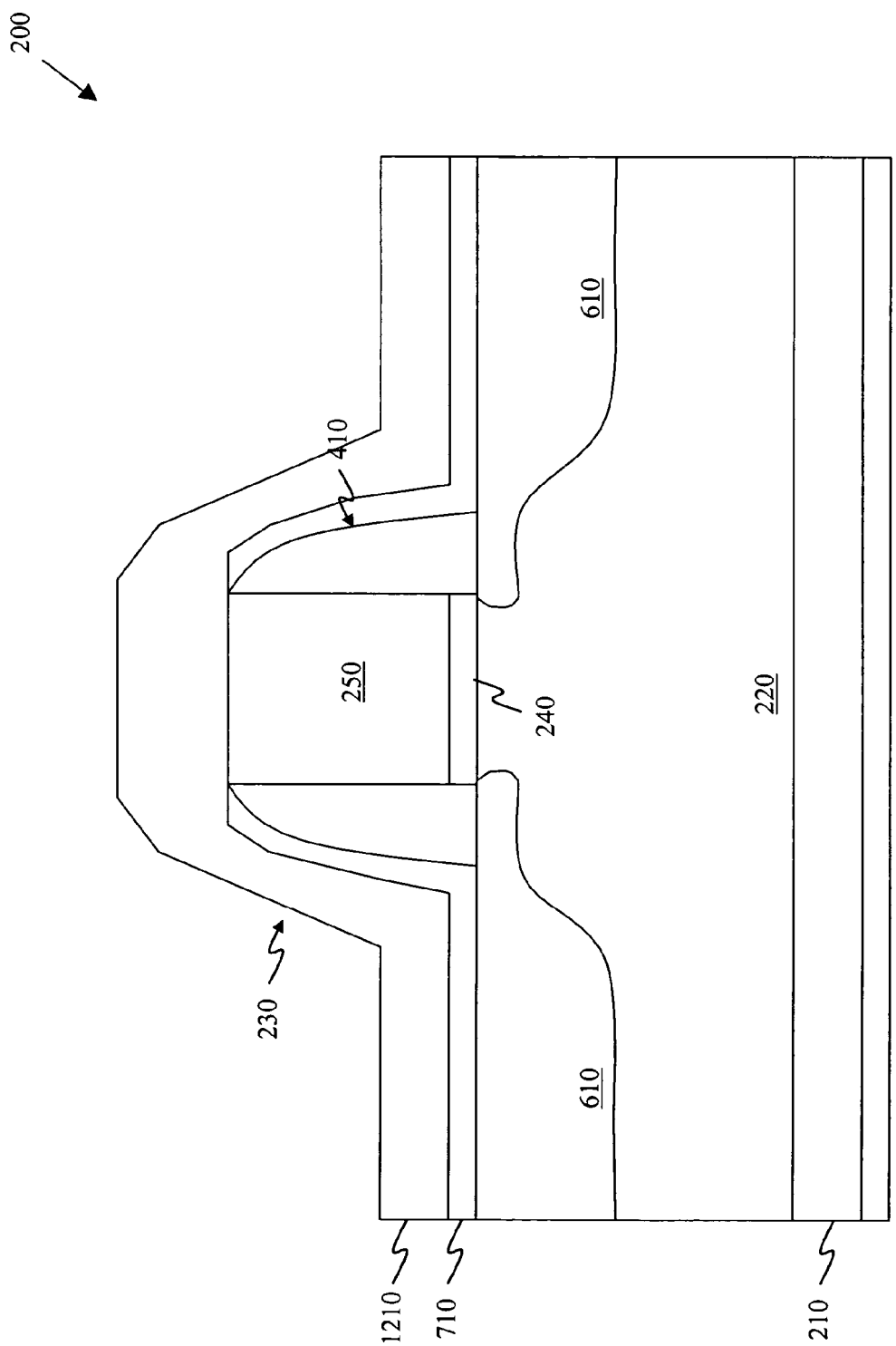
FIG. 12 illustrates a cross-sectional view of the partially completed semiconductor device illustrated in FIG. 11 after forming a silicidation metal over the exposed portions of the polysilicon gate electrode.

Turning now to FIG. 12, illustrated is a cross-sectional view of the partially completed semiconductor device 200 illustrated in FIG. 11 after forming a silicidation metal 1210 over the exposed portions of the polysilicon gate electrode 250. In the particular embodiment shown, the silicidation metal 1210 is actually blanket deposited over the entire surface of the semiconductor device 200. The silicidation metal 1210 in the embodiment shown in FIG. 12 happens to be a nickel layer, however, other materials that react with silicon to form a silicide could easily be used. For instance, it is known that the silicidation metal 1210 may also comprise cobalt, platinum, titanium, tantalum, molybdenum, tungsten, another similar metal, or any combination thereof while staying within the scope of the present invention.

In a preferred embodiment, the silicidation metal 1210 is designed to fully silicidize the polysilicon gate electrode 250. As it takes approximately 1 nm of nickel to fully silicidize approximately 1.8 nm of polysilicon, the thickness of the silicidation metal 1210 should be at least 56% of the thickness of the polysilicon gate electrode 250. To be comfortable, however, it is suggested that the thickness of the silicidation metal 1210 should be at least 60% of the thickness of the polysilicon gate electrode 250. Thus, where the thickness of the polysilicon gate electrode 250 ranges from about 50 nm to about 150 nm, as described above, the thickness of the silicidation metal 1210 should range from approximately 30 nm to about 90 nm.

In an alternative embodiment of the invention, a thinner layer of silicidation metal 1210 may be formed over the exposed portions of the polysilicon gate electrode 250, as well as over the remainder of the semiconductor device 200. In this instance, the thinner layer of silicidation metal 1210 will only react with the top portion of the polysilicon gate electrode 250, to form a partially silicided gate electrode. The thickness of the thinner layer of silicidation metal 1210 could range from about 3 nm to about 15 nm to only partially silicide the silicided gate electrode. This embodiment is particularly useful for applications where a poly-gate oxide interface is used, rather than a silicide-gate oxide interface, as is the case in the fully silicided gate electrode discussed directly above.

Figure 13:
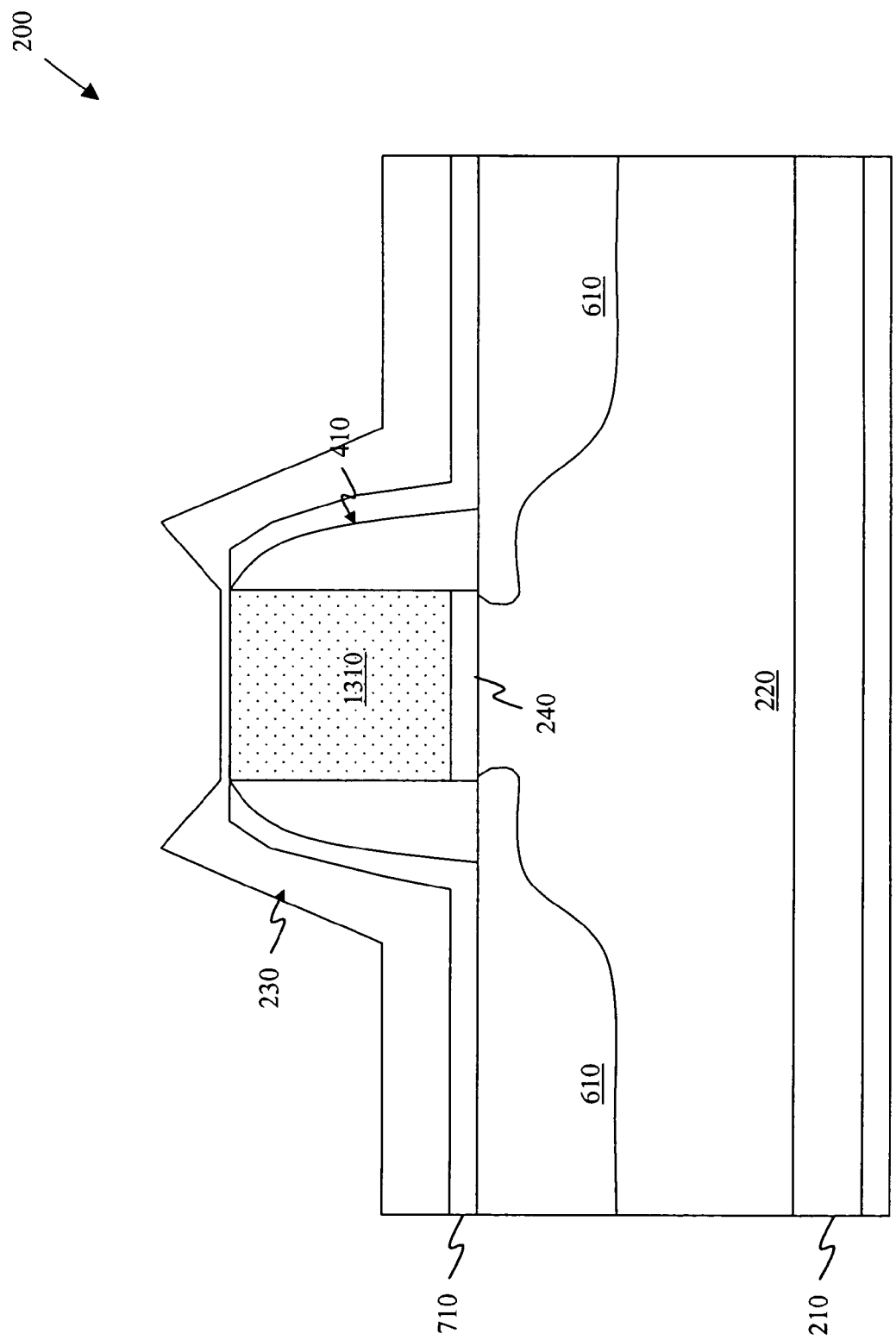
FIG. 13 illustrates the partially completed semiconductor device illustrated in FIG. 12 after converting the polysilicon gate electrode to a silicided gate electrode.

Turning now to FIG. 13, illustrated is the partially completed semiconductor device 200 illustrated in FIG. 12 after converting the polysilicon gate electrode 250 to a silicided gate electrode 1310. Those skilled in the art understand the steps that might be required to form the silicided gate electrode 1310, including subjecting the polysilicon gate electrode 250 and metal silicide layer 1210 to a rapid thermal anneal (RTA) process. This RTA is designed to convert the polysilicon gate electrode 250 to the silicided gate electrode 1310. The annealing temperature depends on the silicide metal being used. For example, it is believed that the RTA may be conducted at a temperature ranging from about 350° C. to about 550° C. and a time period ranging from about 10 second to about 100 seconds to accomplish the silicidation when nickel is used. It should be noted that other temperatures, times, and processes could be used if another metal were used.

Figure 14:
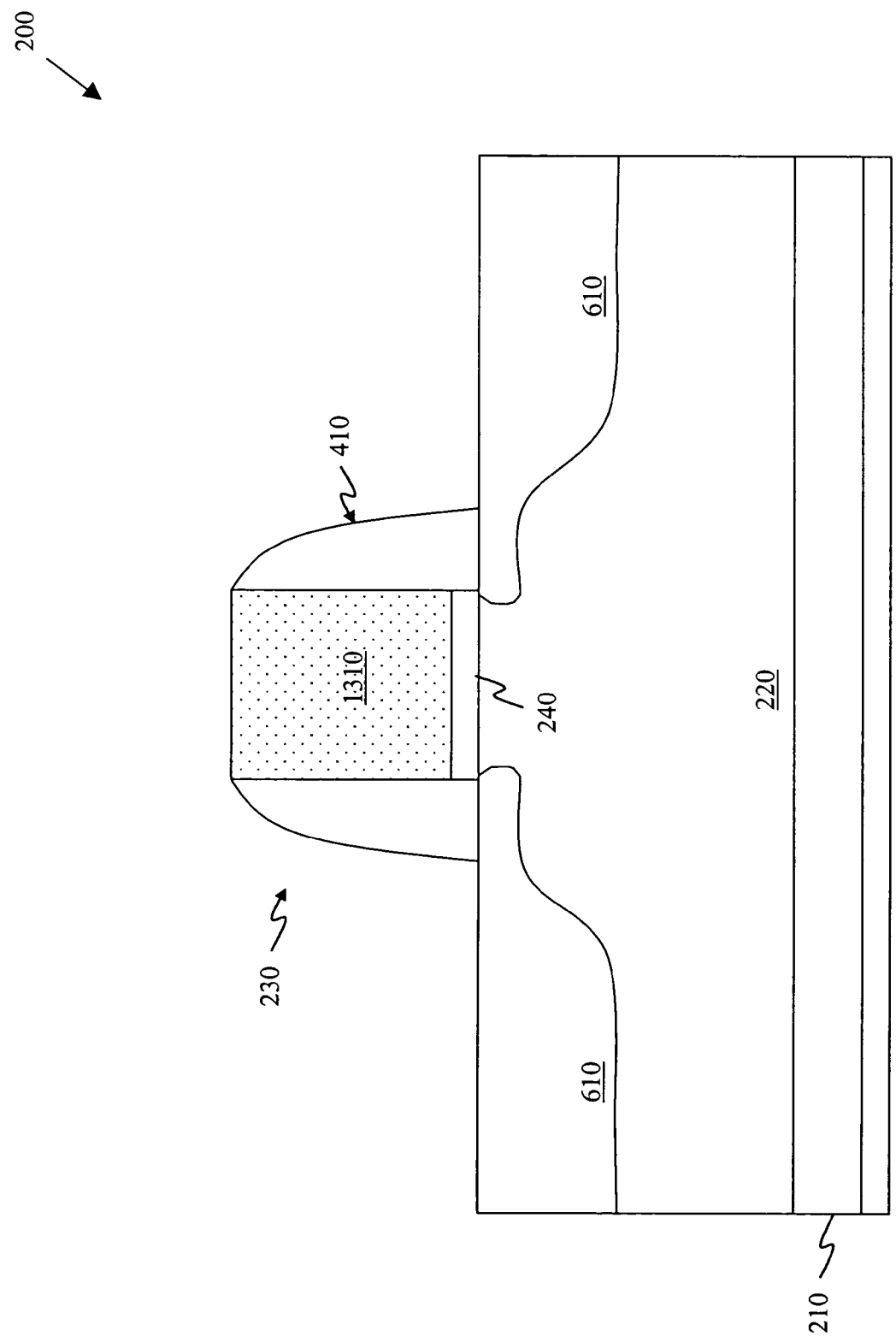
FIG. 14 illustrates the partially completed semiconductor device illustrated in FIG. 13 after removing any un-reacted portions of the silicidation metal, as well as removing all remaining portions of the protective layer.

Turning now to FIG. 14, illustrated is the partially completed semiconductor device 200 illustrated in FIG. 13 after removing any un-reacted portions of the silicidation metal 1210, as well as removing all remaining portions of the protective layer 710. The removal of these two layers may be easily accomplished using a conventional selective removal process. For instance, in one embodiment of the invention the device could be subjected to an etch recipe consisting of sulfuric acid ($H_2SO_4$), hydrogen peroxide ($H_2O_2$) and water ($H_2O$). This specific etch recipe has a high degree of selectivity and could easily remove any remaining portions of the silicidation metal 1210 and the protective layer 710. Other processes or etch chemistries could nevertheless be used to remove the remaining portions of the silicidation metal 1210 and protective layer 710.

Figure 15:
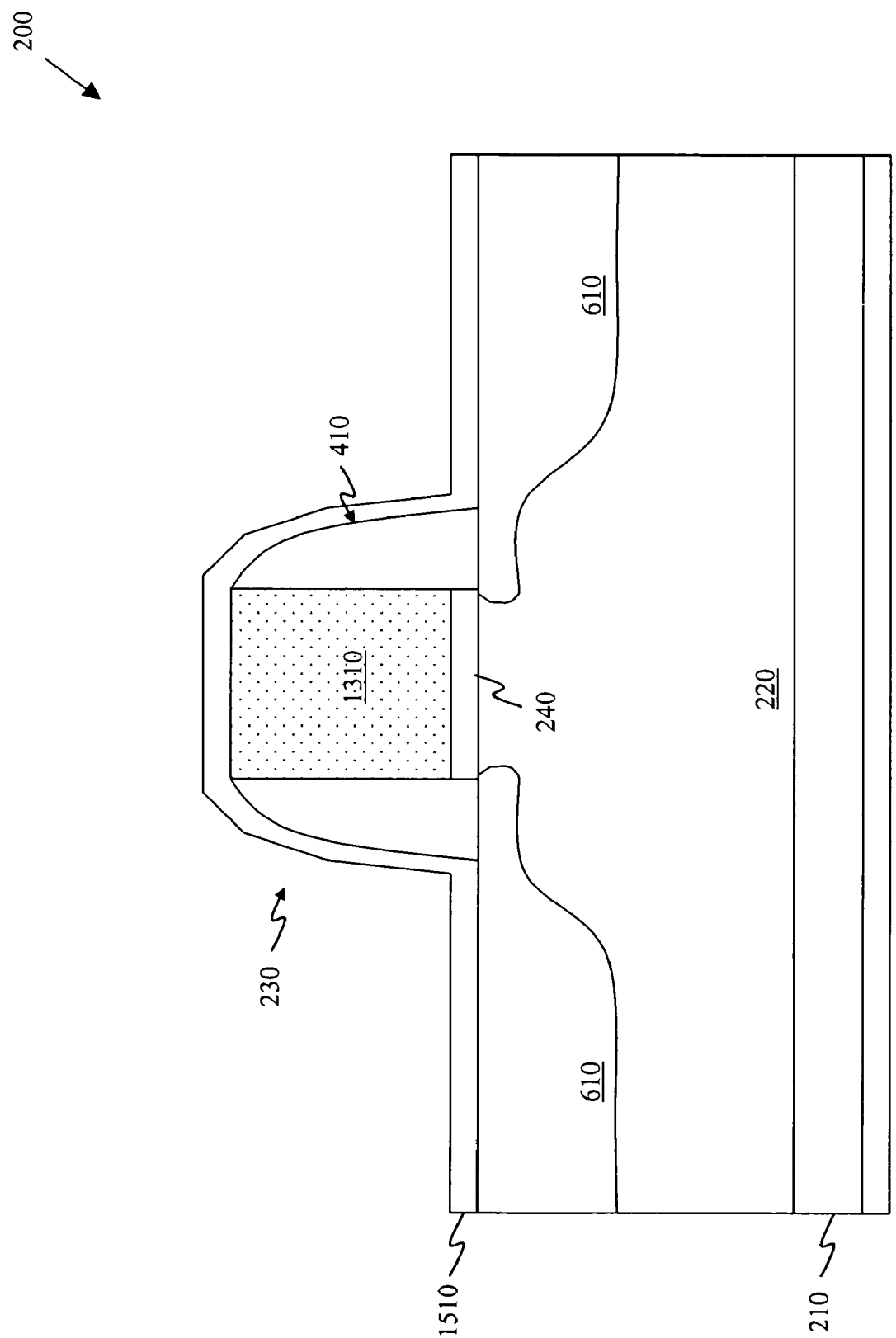
FIG. 15 illustrates the partially completed semiconductor device illustrated in FIG. 14 after forming a silicidation metal over the exposed portions of the source/drain regions as well as over the gate structure.

Turning now to FIG. 15, illustrated is the partially completed semiconductor device 200 illustrated in FIG. 14 after forming a silicidation metal 1510 over the exposed portions of the source/drain regions 610 as well as over the gate structure 230. The silicidation metal 1510 in the embodiment shown in FIG. 15 happens to be a thin nickel layer, however, other materials that react with silicon to form a silicide could easily be used. For instance, it is known that the silicidation metal 1510 may also comprise cobalt, platinum, titanium, tantalum, molybdenum, tungsten, another similar metal, or any combination thereof while staying within the scope of the present invention. In the embodiment of FIG. 15, the silicidation metal 1510 comprises the same metal as the silicidation metal 1210 (FIG. 12). Nonetheless, this is not required to remain within the scope of the present invention.

The silicidation metal 1510 may be formed using a number of different processes, and may be formed to a number of different thicknesses. In one embodiment of the invention the silicidation metal 1510 is deposited to a thickness ranging from about 5 nm to about 15 nm. Such thicknesses, however, might be used when the silicidation metal 1510 comprises nickel. Various other thicknesses could be used if the silicidation metal 1510 were to comprise one of the different metals disclosed above.

Figure 16:
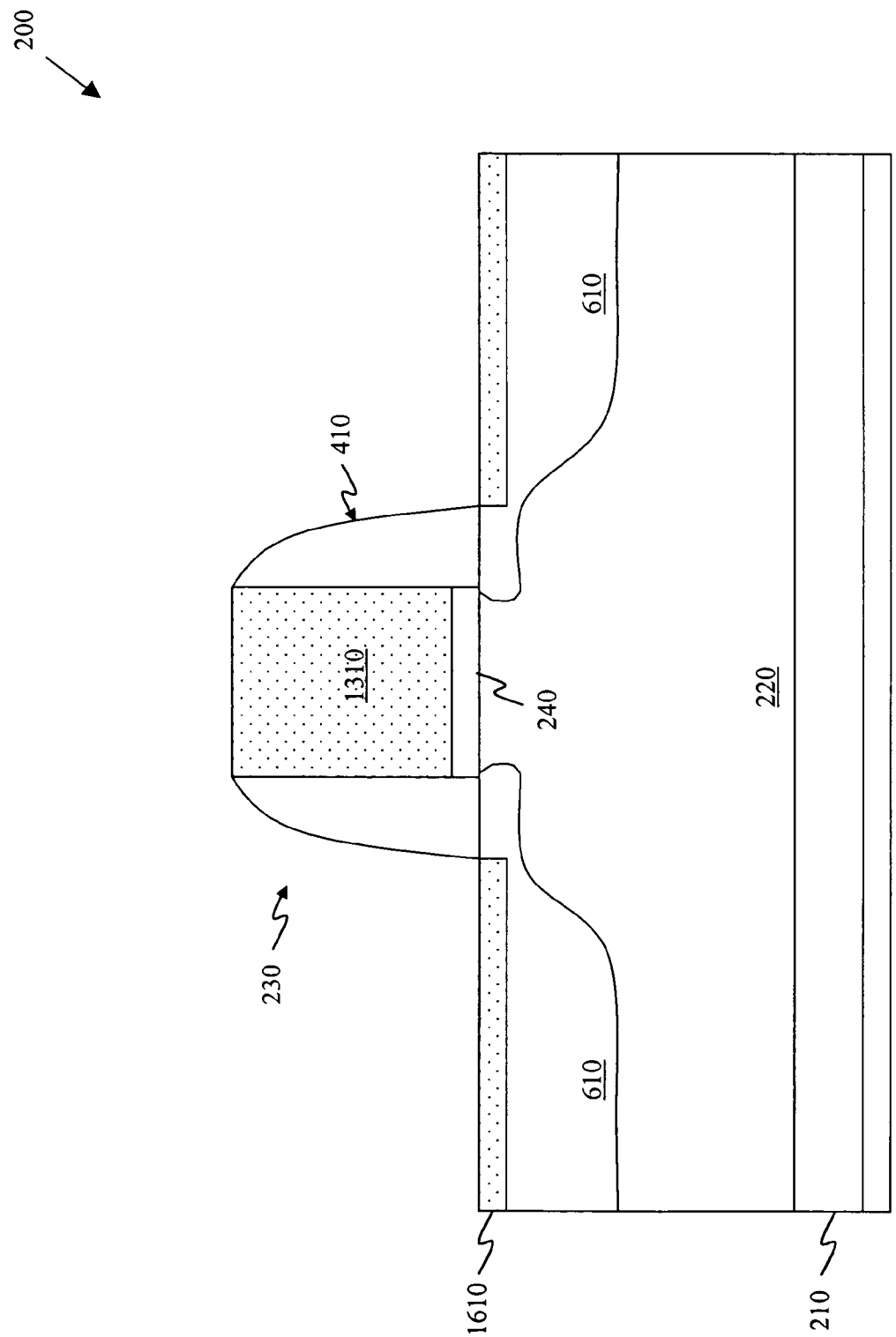
FIG. 16 illustrates a cross-sectional view of the partially completed semiconductor device illustrated in FIG. 15 after subjecting it to a rapid thermal anneal (RTA) and removing any un-reacted portions of the silicidation metal.

Turning now to FIG. 16, illustrated is a cross-sectional view of the partially completed semiconductor device 200 illustrated in FIG. 15 after subjecting it to an RTA process. This RTA attempts to cause the silicidation metal 1510 to react with the silicon of the source/drain regions 610 to form source/drain contact regions 1610. In the instance where the silicidation metal 1510 comprises nickel, the RTA causes the nickel to react with the silicon to form a nickel silicide.

The RTA may be conducted using a variety of different temperatures and times. Nonetheless, it is believed that the RTA, in an exemplary embodiment, should be conducted in a rapid thermal processing tool at a temperature ranging from about 400° C. to about 600° C. for a time period ranging from about 5 seconds to about 60 seconds. The specific temperature and time period are typically based, however, on the ability to form the source/drain contact regions 1610 to a desired depth, as well as the silicide materials selected.

A selective wet etch, using for example a mixture of sulfuric acid ($H_2SO_4$), hydrogen peroxide ($H_2O_2$) and water ($H_2O$), may then be used to remove un-reacted silicidation metal 1510. Additionally, another optional RTA step may be used to form a low resistivity phase of the silicide. Thereafter the manufacture of the partially completed semiconductor device 200 would continue in a conventional manner, optimally resulting in a device similar to the semiconductor device 100 illustrated in FIG. 1. It should be noted that the exact order of the steps illustrated with respect to FIGS. 2–16 may change depending on the process flow. Additionally, various other steps could be added to the description of FIGS. 2–16.

The method of manufacturing the semiconductor device as discussed with respect to FIGS. 2–16 provides many benefits over the prior art methods. First, and possibly most important, it separates the formation of the silicided gate electrode and source/drain contact regions (e.g., silicided source/drain contact regions) into different steps. Advantageously, this allows the depth of the source/drain contact regions (e.g., silicided source/drain contact regions) to be independent of the thickness of the silicided gate electrode. Advantageously, the method of the present invention is applicable to devices having different step heights, whether by design or process variation. The techniques of the prior art are not capable of accepting such variations in step heights.

Figure 17:
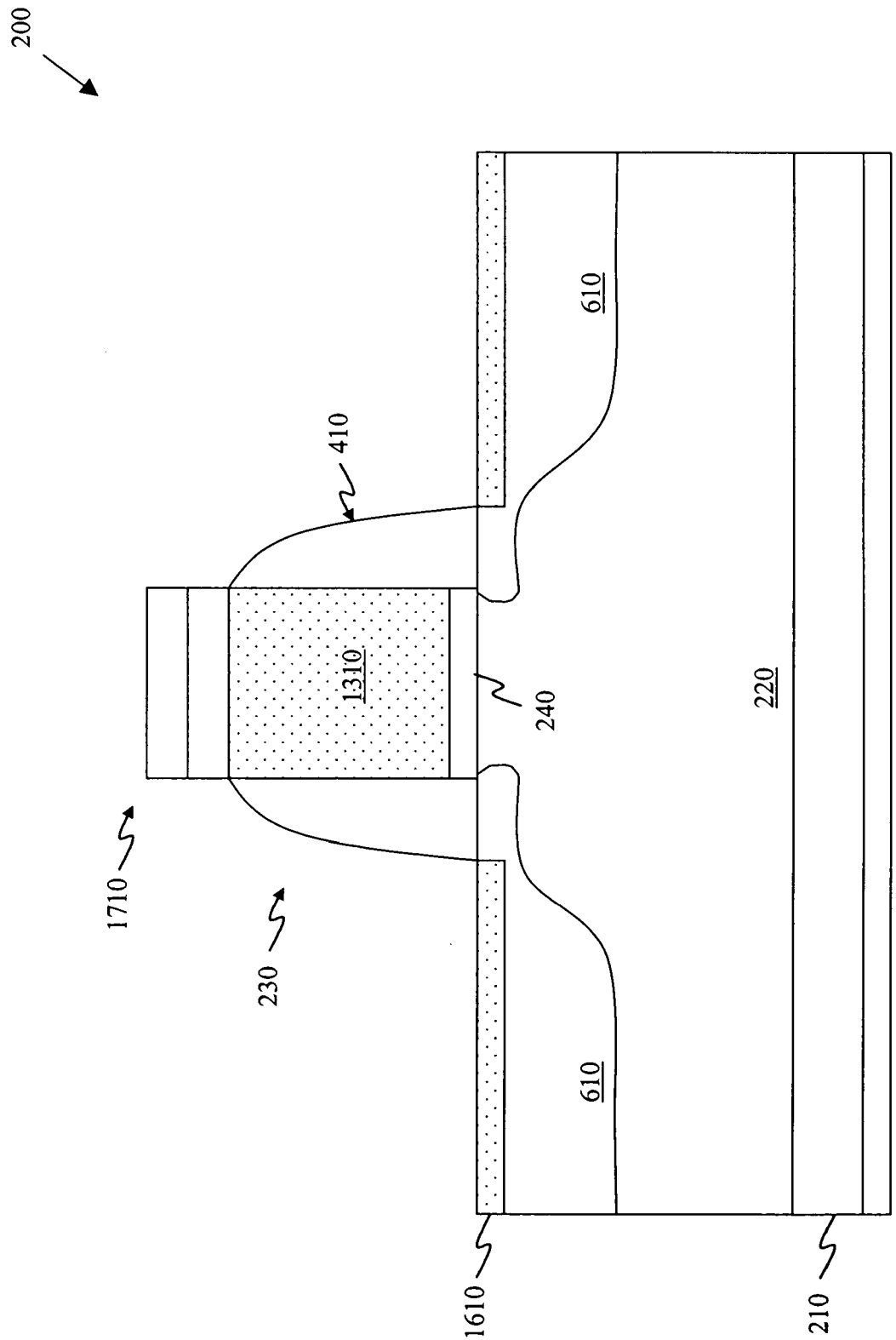
FIG. 17 illustrates a cross-sectional view of an embodiment of the present invention wherein the method of manufacturing semiconductor devices as discussed with respect to FIGS. 2–16 is applied to fabricate a high performance stacked capacitor.

Turning briefly to FIG. 17, illustrated is a cross-sectional view of an embodiment of the present invention wherein the method of manufacturing semiconductor devices as discussed with respect to FIGS. 2–16 is applied to fabricate a high performance stacked capacitor 1710. Using the process sequences described above, the first electrode (or the bottom electrode) of the capacitor 1710 can be fully silicided. Subsequently, the insulator over the first electrode and the second electrode can be formed using conventional methods. Due to the elimination of the poly depletion at the interface between the first electrode and gate oxide by full silicidation, the performance of the stacked capacitors is enhanced.

Figure 18:
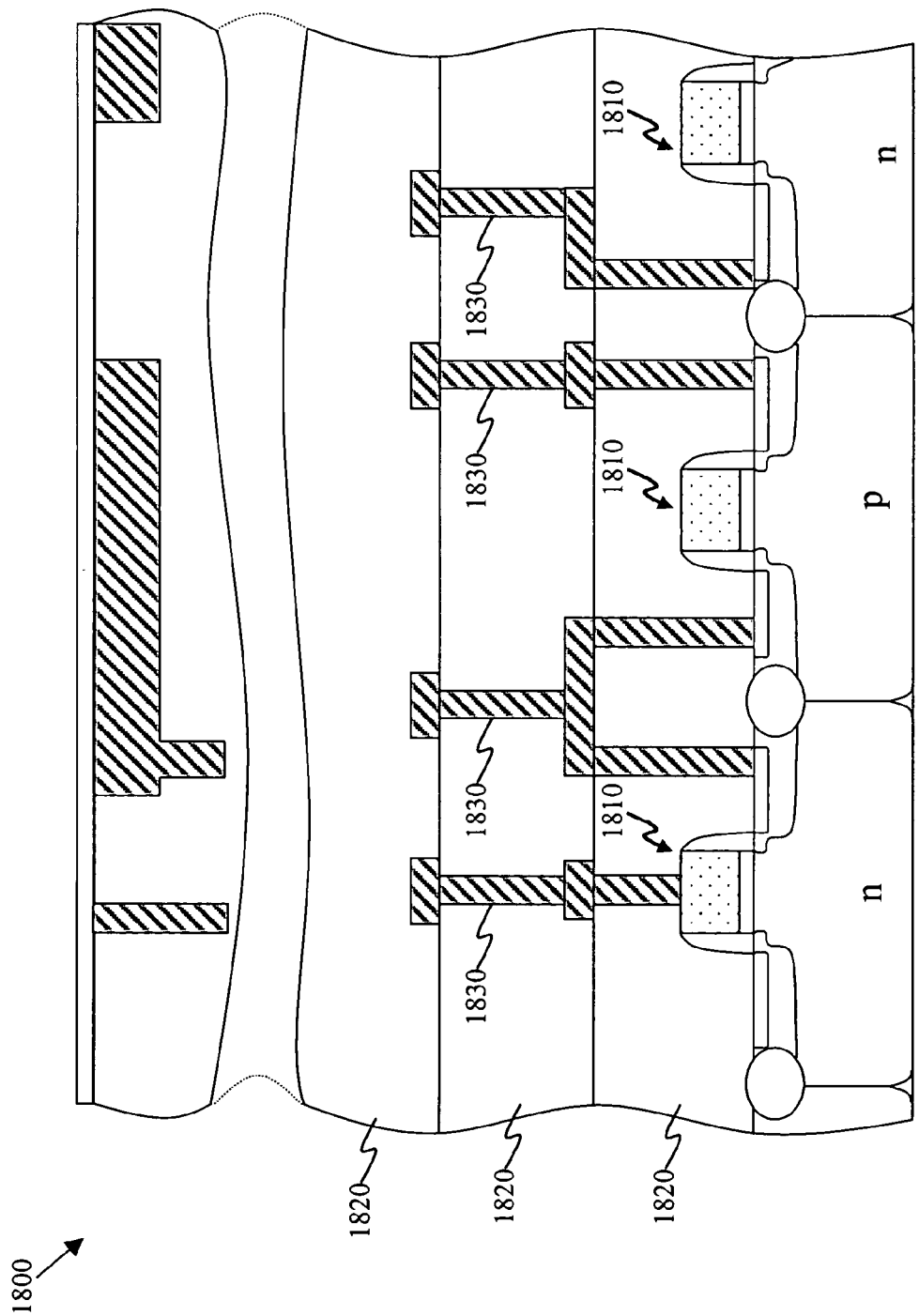
FIG. 18 illustrates an exemplary cross-sectional view of an integrated circuit (IC) incorporating devices constructed according to the principles of the present invention.

Referring now to FIG. 18, illustrated is an exemplary cross-sectional view of an integrated circuit (IC) 1800 incorporating devices 1810 constructed according to the principles of the present invention. The IC 1800 may include devices, such as transistors used to form CMOS devices, BiCMOS devices, Bipolar devices, as well as capacitors or other types of devices. The IC 1800 may further include passive devices, such as inductors or resistors, or it may also include optical devices or optoelectronic devices. Those skilled in the art are familiar with these various types of devices and their manufacture. In the particular embodiment illustrated in FIG. 18, the IC 1800 includes the devices 1810 having dielectric layers 1820 located thereover. Additionally, interconnect structures 1830 are located within the dielectric layers 1820 to interconnect various devices, thus, forming the operational integrated circuit 1800.

Although the present invention has been described in detail, those skilled in the art should understand that they can make various changes, substitutions and alterations herein without departing from the spirit and scope of the invention in its broadest form.

What is claimed is:
1. A method for manufacturing a semiconductor device, comprising:
   forming a polysilicon gate electrode over a substrate;
   forming source/drain regions in the substrate proximate the polysilicon gate electrode;
   forming a protective layer over the source/drain regions and the polysilicon gate electrode;

removing the protective layer from over a top surface of the polysilicon gate electrode while leaving the protective layer over the source/drain regions; and fully siliciding the polysilicon gate electrode to form a fully silicided gate electrode;

removing the protective layer from over the source/drain regions; and after fully siliciding the polysilicon gate electrode, siliciding at least a portion of the source/drain regions.

2. The method as recited in claim 1 wherein the protective layer comprises a transition metal nitride.

3. The method as recited in claim 1 wherein the protective layer comprises a transition metal carbide.

4. The method as recited in claim 1 further including forming a masking layer over portions of the protective layer located over the source/drain regions and the polysilicon gate electrode then removing the masking layer and protective layer from over the top surface of the polysilicon gate electrode.

5. The method as recited in claim 4 wherein the masking layer comprises an organic material.

6. The method as recited in claim 5 wherein the masking layer comprises photoresist or BARC.

7. The method as recited in claim 1 wherein removing the protective layer from over the top surface of the polysilicon gate electrode includes removing the protective layer from over the top surface of the polysilicon gate electrode using a chemical mechanical planarization or etch process.

8. A method for manufacturing an integrated circuit, comprising:

forming semiconductor devices over a substrate, including;

forming a polysilicon gate electrode over the substrate;

forming source/drain regions in the substrate proximate the polysilicon gate electrode;

forming a protective layer over the source/drain regions and the polysilicon gate electrode;

removing the protective layer from over a top surface of the polysilicon gate electrode while leaving the protective layer over the source/drain regions;

fully siliciding the polysilicon gate electrode to form a silicided gate electrode while said protective layer covers the source/drain regions;

then, removing any remaining portions of the protective layer; and then, siliciding at least a portion of the source/drain regions; and forming interconnects within dielectric layers located over the substrate for electrically contacting the semiconductor devices.

9. The method as recited in claim 8 wherein the protective layer comprises a transition metal nitride.

10. The method as recited in claim 8 wherein the protective layer comprises a transition metal carbide.

11. The method as recited in claim 8 further including forming a masking layer over portions of the protective layer located over the source/drain regions and the polysilicon gate electrode then removing the masking layer and protective layer from over the top surface of the polysilicon gate electrode.

12. The method as recited in claim 11 wherein the masking layer comprises an organic material.

13. The method as recited in claim 12 wherein the masking layer comprises photoresist or BARC.

14. The method as recited in claim 8 wherein removing the protective layer from over the top surface of the polysilicon gate electrode includes removing the protective layer from over the top surface of the polysilicon gate electrode using a chemical mechanical planarization or etch process.

15. A method for manufacturing a semiconductor device, comprising the following steps, performed in order:

forming a polysilicon gate electrode over a substrate;

forming source/drain regions in the substrate proximate the polysilicon gate electrode;

forming a protective layer over the source/drain regions and the polysilicon gate electrode;

removing the protective layer from over a top surface of the polysilicon gate electrode while leaving the protective layer over the source/drain regions;

fully siliciding the polysilicon gate electrode to form a silicided gate electrode;

then, removing the protective layer to expose the source/drain regions;

then, depositing a silicidation metal on the exposed source/drain regions as well as on the silicided gate electrode;

then, reacting the silicidation metal to form source/drain contact regions; and forming interconnects within dielectric layers located over the substrate for electrically contacting the semiconductor devices.

* * * * *